United States Patent [19]
Souto et al.

[11] Patent Number: 5,194,698
[45] Date of Patent: Mar. 16, 1993

[54] APPARATUS AND METHOD USING A PERMANENT MANDREL FOR MANUFACTURE OF ELECTRICAL CIRCUITRY

[75] Inventors: Mark A. Souto, Huntington Beach; Christopher M. Schreiber, Newport Beach, both of Calif.

[73] Assignee: Hughes Aircraft Company, Los Angeles, Calif.

[21] Appl. No.: 580,748

[22] Filed: Sep. 11, 1990

[51] Int. Cl.$^5$ .............................................. H05K 1/00
[52] U.S. Cl. ..................................... 174/250; 29/848; 174/255
[58] Field of Search ............... 156/640, 641, 644, 656, 156/634, 901; 174/250, 255, 259; 361/412; 29/848, 849, 846, 830

[56] References Cited

U.S. PATENT DOCUMENTS

| | | | |
|---|---|---|---|
| 2,734,150 | 2/1956 | Beck | 29/849 X |
| 3,532,802 | 10/1970 | Spall | 156/901 X |
| 4,581,098 | 4/1986 | Gregor | 156/901 X |
| 4,733,292 | 3/1988 | Jarvis | 156/656 X |
| 4,755,257 | 7/1988 | Yamamoto | 156/640 X |
| 4,853,277 | 8/1989 | Chant | 29/846 X |
| 4,980,016 | 12/1990 | Toda et al. | 156/901 X |
| 5,046,238 | 9/1991 | Daigle et al. | 361/412 X |

FOREIGN PATENT DOCUMENTS

| | | |
|---|---|---|
| 0056668 | 7/1982 | European Pat. Off. . |
| 0185998 | 7/1986 | European Pat. Off. . |
| 1206975 | 12/1965 | Fed. Rep. of Germany . |
| 2203569 | 8/1973 | Fed. Rep. of Germany . |

*Primary Examiner*—Leo P. Picard
*Assistant Examiner*—Trinidad Korka
*Attorney, Agent, or Firm*—Terje Gudmestad; Jeannette M. Walder; Wanda K. Denson-Low

[57] ABSTRACT

A stainless steel mandrel (10) is etched with a negative pattern (16) of an electrical circuit that is to be made with the mandrel and then covered with Teflon (20) which is subsequently lapped to provide a coplanar surface of stainless steel and Teflon. A pattern of electrical conductors (30) is then electroformed, as by electrolytic or electroplating, on the exposed surfaces of the mandrel between the embedded Teflon. Surfaces of the electrical conductors of the circuit are then processed, as required for enhanced adhesion to a substrate, and a dielectric substrate of polyamide and acrylic is then laminated upon the surface of the mandrel over the electroformed conductors so that the dielectric substrate adheres to the conductors. The assembly of dielectric substrate and conductors is then separated from the planar surface of the mandrel and its embedded Teflon.

21 Claims, 2 Drawing Sheets

APPARATUS AND METHOD USING A PERMANENT MANDREL FOR MANUFACTURE OF ELECTRICAL CIRCUITRY

BACKGROUND OF THE INVENTION

1. Field of the Invention

The present invention relates to manufacture of electrical circuitry and, more particularly, concerns manufacture of electrical circuitry by fully additive electroforming processes.

2. Description of Related Art

Printed electrical circuits, including both rigid and flexible printed electrical circuits, generally comprise a pattern of electrical conductors or conductive traces carried by and bonded to a dielectric. Printed circuitry, at present, whether flexible circuits or circuits on relatively rigid boards, is made by well known etching processes. Conventional steps employed in such etching processes include covering a dielectric substrate with a coat of conductive material, such as copper, which will form the traces of the circuit, and then coating the copper with a resist. Artwork in the form of a mask having a pattern of optically-opaque and optically-transmissive portions formed therein is applied over the resist, and the latter is then optically exposed through the mask so that portions of the resist which have been exposed to light may be developed. Those portions of the resist which have not been exposed and developed are then removed to leave a positive pattern of resist on the copper surface. The assembly of substrate, copper and positive pattern of resist is then subjected to etching fluids which do not affect the resist but which remove the copper in areas not covered by resist. The developed resist is then stripped to provide the desired pattern of copper conductors or traces bonded to the dielectric substrate.

Conventional etched circuit processes have a number of disadvantages. Dimensional precision is difficult to achieve. The use of various etching, stripping and cleaning fluids require special handling of hazardous chemicals. Techniques for disposal of the resulting effluents are complex and expensive, and subject to strict government controls. Etched circuit processing has a relatively low yield, greatly increasing the cost of the processing, which inherently involves a large number of costly processing steps.

Plating mandrels have been employed in the past for the manufacture of relatively large parts. Such mandrels are formed in desired configurations, and then a part, such as, for example, an internally finned waveguide, is electroplated upon the mandrel. After the electroplating, the part is separated from the mandrel. The mandrel may be dissolved if it is located in the interior of the part that is made. However, such mandrels have not been employed for the manufacture of electrical circuitry, nor for laminating electroplated components to another medium or substrate.

Accordingly, it is an object of the present invention to provide methods and apparatus for manufacture of electrical circuitry employing permanent mandrels, and which avoid problems attendant upon etched circuit processing.

SUMMARY OF THE INVENTION

In carrying out principles of the present invention in accordance with a preferred embodiment thereof, electrical circuitry is fabricated by forming an electrically conductive mandrel substrate having a working surface and forming a pattern of electrically nonconductive material in the substrate to provide a nonconductive material surface adjacent the substrate conductive working surface. A pattern of electrical conductors is then electroformed on conductive areas of the working surface, which are separated by the nonconductive pattern. A dielectric is then laminated upon the mandrel, and bonded to the pattern of electrical conductors, in a manner to position the dielectric over and around the conductors. The dielectric, with its bonded conductors, is then separated from the mandrel substrate and from the nonconductive material thereon, thereby providing a laminate of dielectric material having bonded conductors. In applications of this process for circuit manufacture, no etching is employed.

DESCRIPTION OF A PREFERRED EMBODIMENT

According to principles of the present invention, electrical circuitry is manufactured by employing a reusable, permanent electroforming master or mandrel which eliminates conventional photolithographic and chemical milling processes used in conventional printing and etching circuit fabrication. Conventional circuit fabrication may be termed "subtractive circuit fabrication", since, for example, a full sheet of conductive material, such as copper, is used as a starting point and portions thereof are removed by chemical milling or etching. The present invention embodies fully additive fabrication techniques.

According to principles of the invention, there is first manufactured a permanent, reusable mandrel having a negative pattern of nonconductive material and a working surface forming a positive pattern of conductive material. The conductive and nonconductive materials may form a smooth, continuous surface and, for manufacture of flat, planar circuitry, are preferably coplanar.

Figure 1:
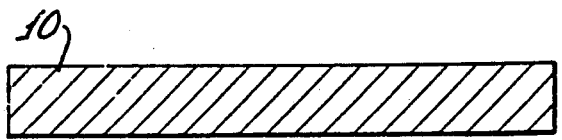
FIG. 1 illustrates a base used for manufacture of a mandrel substrate.
Figure 2:
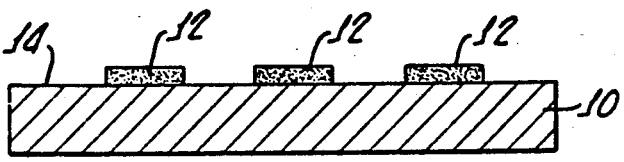
FIG. 2 illustrates a pattern of developed resist formed on the mandrel.
Figure 3:
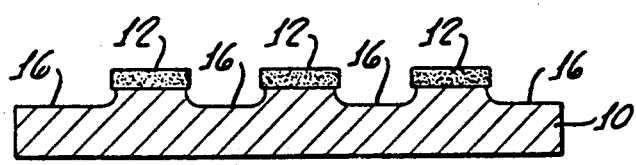
FIG. 3 illustrates the forming of a pattern of grooves in the mandrel.

As illustrated in FIG. 1, a base 10 is formed of a strongmaterial having at least an electrically conductive surface and may, for example, be formed of a solid sheet of stainless steel having a thickness of about 3/16 inch. As shown in FIG. 2, a positive pattern of resist material 12 is then formed upon the working surface 14 of the mandrel substrate 10 by conventional resist coating and photo developing methods. The pattern of the resist 12 defines the final circuit pattern. The positive pattern of resist 12 is then used to chemically etch a negative pattern of surface grooves 16 in the working surface of the stainless steel substrate 10, as shown in FIG. 3. Then the resist 12 is removed to provide the grooved stainless steel substrate 10 shown in FIG. 4.

Figure 5:
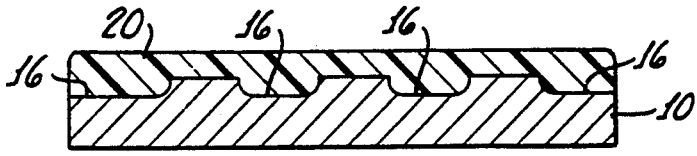
FIG. 5 illustrates application of nonconductive material to the mandrel working surface.
Figure 6:
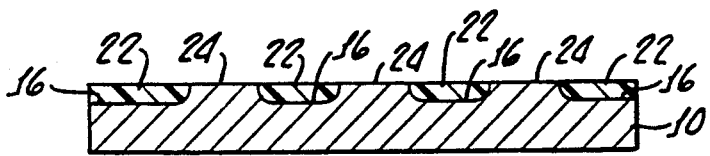
FIG. 6 illustrates the continuous surface of conductive mandrel surface areas and nonconductive embedded material.

A suitable nonconductive material 20, such as, for example, Teflon, is then laminated over the entire working surface of the substrate 10 by conventional processes. For the application of the Teflon, the stainless steel surface may be suitably treated to promote adhesion of the Teflon, and the latter may be applied as by spraying and baking or by otherwise coating, as is well known. Teflon is applied so as to completely fill grooves 16. In order to ensure the complete filling of the grooves, Teflon is applied to a thickness such that it will completely cover the entire surface of the stainless steel substrate, as shown in FIG. 5. Thereafter, as illustrated in FIG. 6, the upper portion of the surface of the Teflon is removed, as by conventional abrasive or lapping processes, to provide a smooth, continuous surface of nonconductive Teflon material 22, completely filling all of the grooves 16, and conductive working surfaces 24 of the substrate 10. As can be seen in FIG. 6, the surfaces of nonconductive Teflon 22 and conductive substrate 24, in this embodiment, together form a single, smooth and continuous surface. This surface may be of any suitable configuration, flat or curved, depending on the nature of the surface of the final product that may be desired. For a flat coplanar electrical circuit, the combined continuous surface of the Teflon and stainless steel is coplanar, as shown in FIG. 6.

Figure 7:
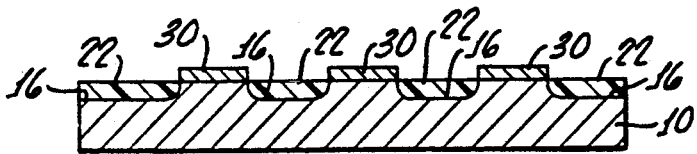
FIG. 7 illustrates electroforming of electrically conductive leads or traces on the mandrel working surface.

FIG. 6 illustrates the finished reusable stainless steel working mandrel. The working mandrel has a positive pattern of electrically conductive surfaces 24 on its working surface and, by virtue of its electrical conductivity, is arranged to accept an electroformed or electrodeposited positive pattern of copper leads 30, as illustrated in FIG. 7. Electroforming of the copper leads or copper traces, or circuit elements of other electrically conductive material, may be performed by conventional electrolytic, electroless, electrophoretic or electrostatic plating techniques. The substrate 10 is made of an electrically conductive material, namely stainless steel, for example, and thus the entire mandrel may be placed in a suitable electroforming bath. For example, the mandrel (in the condition shown in FIG. 6) is placed in an electrolytic bath, with the substrate electrically connected to receive plating current, so that electrically conductive traces 30 are plated up on the conductive surfaces of the mandrel in the positive pattern of the mandrel conductive surfaces.

Other methods of electroforming the raised pattern of conductors 30 may be employed. Thus, the conductive surfaces of the finished mandrel of FIG. 6 may be suitably treated for use in electroless plating, and the mandrel may be simply immersed in an electroless plating bath, such as a nickel electroless plating bath, to provide a conductive pattern 30 formed of electroless plated nickel. The terms "electrodeposit" and "electroform", as used herein, are intended to include electrolytic, electroless and other plating or coating methods. In electrophoretic plating, for example, the mandrel is placed in a slurry having a suitable material (such as a metal oxide) to be electrodeposited suspended therein and an electrical signal applied to the conductive mandrel causes deposition of material from the slurry upon the conductive mandrel surfaces.

Figure 8:
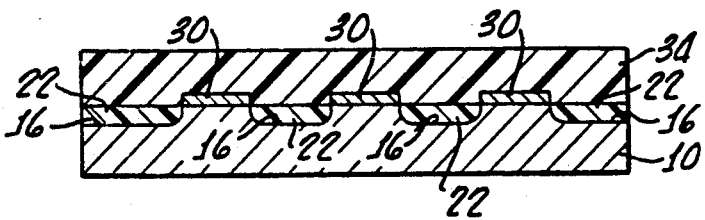
FIG. 8 illustrates lamination of a dielectric to the mandrel and the electroformed conductors thereon.

Having electrodeposited the conductive pattern of traces 30, a dielectric substrate for the circuit is then laminated upon the surface of the mandrel, and upon the pattern of conductors, as illustrated in FIG. 8. As one example of a suitable dielectric, a layer of a polyamide, such as Kapton, covered with an acrylic adhesive, is laminated upon the mandrel with its electroformed conductors 30, and with the acrylic adhesive in contact with the conductors. The lamination is formed under heat and pressure, applying, for example, a pressure of 300 psi at a temperature in the order of 370° F. The acrylic adhesive, at such temperatures and pressures, becomes plastic and flows closely over and around the top surfaces and edges of the conductors 30. The Kapton and acrylic laminate, applied as indicated in FIG. 8, may employ different thicknesses of materials, such as, for example, a one mil layer of Kapton covered with a one or two mil layer of acrylic. The thermoplastic acrylic fills all of the pores and cracks in and around the conductors 30, and thus firmly and securely bonds the conductors to the Kapton. Alternatively, the Kapton may be cast directly upon the mandrel at higher temperatures, but without the acrylic.

Figure 9:
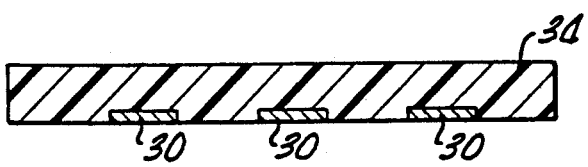
FIG. 9 illustrates the electrical circuit and its substrate removed from the mandrel.

Having laminated the dielectric substrate 34 to the conductors 30, the assembly of dielectric 34 and conductors 30 may then be removed from the mandrel substrate 10, and from the embedded nonconductive Teflon areas 22, to provide the electrical circuit illustrated in FIG. 9, comprising a desired pattern of electrical conductors or traces 30 firmly bonded to and embedded in the dielectric substrate 34. As with the mandrel, the surfaces of the conductors 30 and substrate 34 are continuous and coplanar in this embodiment, so that where a flat mandrel is employed, as shown in FIG. 6, the conductive circuitry is coplanar, with the substrate and conductors embedded therein. A knife edge is inserted at the adjoining surfaces to pry and flexibly peel off the thin dielectric substrate and the copper traces bonded thereto.

In certain types of electrical circuit manufacture, delamination of conductors such as copper conductors is a frequent occurrence because of difficulties encountered in providing good adhesion between the surface of the dielectric substrate and the surface of the copper that is in contact with and bonded to the substrate. This problem of poor bonding may be magnified where a substrate is made of a pre-preg, which is a resin impregnated fiber, with the resin initially in a B stage or partially-cured condition. Many techniques are available to treat the surface of conductors so as to enhance such adhesion, but such techniques may not be readily available in conventional etched circuit forming processes. Surprisingly and unexpectedly, the processing of the present invention enables greatly improved adhesion of the copper leads to its dielectric substrate. When employing the reusable mandrel of the present invention, the partially-formed circuit, in the form illustrated in FIG. 7, wherein the conductive leads have been electroformed upon the mandrel, readily lends itself to the use of any one of a number of different methods for processing the conductor surface so as to enhance adhesion to the substrate which is to be subsequently laminated thereon. In the form illustrated in FIG. 7, the pattern of electrical conductors 30 is readily handled since it is securely carried by the stainless steel mandrel.

Thus, the adhesion side (upper side as illustrated in FIG. 7) of the conductors 30 may have suitable oxide applied thereto by straight chemical processing. Alternatively, electrolytic etching may be employed since the copper conductors are mounted on the conductive stainless steel, and the entire subassembly may be placed in an electrolytic or other bath to roughen the copper surface by chemical or electrical etching or to cause a suitable oxidation, all of which will significantly promote adhesion of the conductors 30 to the dielectric 34.

The described methods of forming electrical circuitry can be applied to manufacture of flexible circuitry where the dielectric substrate 34 is formed of a relatively thin and flexible polyamide and acrylic material, for example, or it may be employed for relatively rigid circuit boards where the dielectric substrate is made of a thicker pre-preg or resin impregnated fiber material. Adherence of the latter substrate to the conductive copper pattern is greatly improved by the described surface treatment of the copper conductors when in the assembly stage illustrated in FIG. 7. Cast dielectric materials also may be used for the dielectric substrate. Such materials include high temperature polyamides and others that may be cast directly upon the mandrel at higher temperatures and thus provide an end product that may be used at higher temperatures. Where the dielectric substrate and conductor pattern is flexible, or where the mandrel itself is thin enough to be flexible, the two may be separated by peeling the flexible parts from the other.

Although a mandrel made of stainless steel having a negative pattern of grooves filled with Teflon is presently preferred, it will be readily appreciated that other materials for the electrically conductive mandrel and for filling the mandrel substrate grooves with electrically nonconductive material may be employed. Thus, for example, the mandrel substrate may be made of nickel or brass or like materials, and other electrically nonconductive materials, such as ceramics and Fluorinated Ethylene Propylene (FEP), may be employed for filling the grooves. The electroformed copper does not have a strong adhesion to the surfaces of the mandrel substrate when the latter is formed of stainless steel or nickel, since these surfaces are inherently passivated, i.e. formed with an oxidation surface. If deemed necessary or desirable, the positive pattern of the mandrel surface may be suitably treated, as by passivation or phosphating, to facilitate release of the electroformed conductors from the mandrel. If the mandrel is made of copper or brass, the surfaces may be provided with a chromate conversion coating, as by dipping, to provide a thin conductive layer that has a decreased adhesion to the electrodeposited conductive leads. The Teflon itself is readily released from the polyamide and acrylic or other dielectric, and thus the finished electrical circuit of FIG. 9 may be readily separated from the reusable mandrel.

Figure 4:
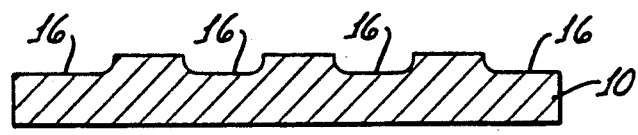
FIG. 4 illustrates the grooved mandrel after removal of the resist.
Figure 10:
FIGS. 10-12 illustrate a method of forming a working mandrel from a master mandrel.
Figure 11:
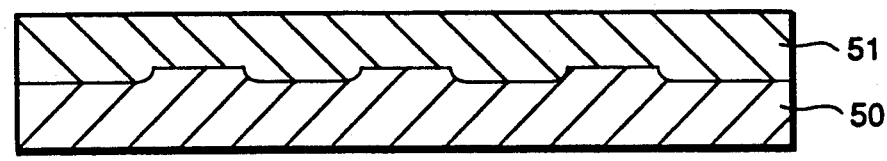
Figure 12:
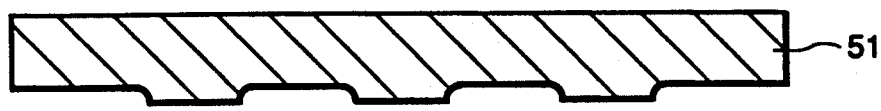

Although grooves 16 have been disclosed as being formed by etching, it will be understood that these grooves may alternatively be formed by other well known techniques such as machining, EDM (electron discharge machining), punching or the like. Alternatively, a working mandrel may be made by electroforming on a master mandrel with dielectric being applied only to the working mandrel. The precision master is used only to make working mandrels while the latter are used to make circuitry. To make an electroformed working mandrel, a master mandrel 50 is first formed to provide a negative pattern of grooves which are not filled so that the master mandrel 50 will appear as illustrated in FIG. 4 and FIG. 10, but the pattern of grooves 16 will be a negative pattern rather than a positive pattern. As illustrated in FIG. 11, a mandrel substrate 51 is then electroformed, as by electrolytic or electroless plating or the like, on the master mandrel 50 after the master has had its surface passivated to promote release of the working mandrel that is to be formed thereon. Then the working mandrel 51 is separated from the master mandrel 50 as shown in FIG. 12 and will have a pattern of grooves therein corresponding to the surfaces indicated at 24 in FIG. 6 of the master mandrel. The working mandrel 51 at this point will appear substantially like the Teflon 20 of FIG. 5 that is coated upon the working mandrel and will be formed of an electrically conductive material, such as copper or nickel or the like. The working mandrel has a pattern of grooves formed therein which are then filled with Teflon, just as is the mandrel of FIGS. 1 through 8, with the Teflon then being lapped to provide a smooth continuous surface of an embedded negative pattern of Teflon adjacent a co-planar electrically conductive pattern. In this manner a number of working mandrels may be made quickly and relatively inexpensively without the need for repetitively precision forming of the original pattern formed on the master mandrel from which the working mandrels are made.

After removal of the electrical circuit from the mandrel, the latter may be cleaned, as by use of a nitric acid solution for a stainless steel mandrel, to remove any remaining copper, and the mandrel of FIG. 6 is again ready for use. If deemed necessary or desirable, the Teflon may be removed from the mandrel substrate grooves and the grooves refilled by again coating the mandrel substrate and lapping the Teflon coating, as in the steps illustrated in FIGS. 5 and 6.

There have been disclosed methods and apparatus for fabricating an etched circuit by fully additive processes which completely avoid the use of resist, development and etching in the manufacture of the circuit, and thus eliminate many problems encountered in the use of conventional etching processes.

Although the described mandrel has a coplanar surface of conductive and non-conductive patterns to provide a circuit with embedded conductors that are coplanar with the dielectric substrate, principles of this invention may be used to make a mandrel in which a dielectric pattern lies on and extends above the conductive surface of the mandrel so as to enable production of electrical circuits in which the traces lie on and extend above the surface of the dielectric substrate. Examples of such mandrels are shown in FIG. 4 of co-pending application Ser. No. 580,758 filed Sep. 11, 1990 for Three-Dimensional Electroform Mandrel for Electrical Circuitry and in FIG. 4 of co-pending application Ser. No. 580,749 filed Sep. 11, 1990 for Laser Pattern Ablation Of Fine line Circuitry Masters. The disclosures of both of these applications (owned by the assignee of the present application) are incorporated by this reference as though fully set forth herein.

What is claimed is:

1. A method of additively forming electrical circuitry without employing circuit etching processes, said method comprising the steps of:

providing a mandrel having an electrically conductive pattern on a surface thereof defining configuration of an electrical circuit, wherein said step of providing a mandrel comprises forming a pattern of grooves on a conductive mandrel substrate having a working surface, and filling said grooves with a nonconductive material having a surface coplanar with said working surface,
electrodepositing circuit components on said pattern to define an electrically conductive circuit configured in said pattern,
laminating a dielectric substrate upon said mandrel and circuit components, and
separating said substrate and circuit components from said mandrel to provide a dielectric substrate having a pattern of circuit components thereon.

2. The method of claim 1 wherein at least one of said mandrel and substrate is flexible and wherein said step of separating comprises flexibly peeling said one of said mandrel and substrate from the other.

3. The method of claim 1 including the step of treating said circuit components on said mandrel before said step of laminating to promote adhesion of said components to said substrate.

4. The method of claim 1 wherein said step of forming a pattern of grooves on a conductive mandrel substrate comprises forming a master mandrel having an electrically conductive master pattern of grooves formed therein, treating said master mandrel to promote release of parts electroformed thereon, electroforming a conductive mandrel substrate on said master mandrel, separating said mandrel substrate from said master mandrel, wherein said mandrel substrate has a pattern of grooves which is a negative of the pattern of grooves in said master mandrel.

5. A method of forming electrical circuitry having conductive components comprising:
forming an electrically conductive mandrel substrate having a working surface,
forming a pattern of electrically nonconductive material on said substrate comprising the substeps of forming a pattern of grooves in said working surface, laminating said working surface with a nonconductive material to fill said grooves and cover the working surface between said grooves, and removing a portion of said material down to said working surface and along a surface that is continuous with said working surface,
electroforming a pattern of conductors on said conductive areas of said working surface,
laminating a dielectric upon said mandrel and said pattern of conductors, to position said dielectric over and around said conductors, and
separating said dielectric with said conductors from said mandrel substrate and its nonconductive material to provide a laminate of dielectric material having a pattern of conductors thereon.

6. The method of claim 5 wherein said step of forming an electrically conductive mandrel substrate comprises the steps of forming a master mandrel having a positive pattern of grooves formed therein, said master mandrel being formed of an electrically conductive material, treating said master mandrel to promote release of material to be electroformed thereon, electroforming on said master mandrel an electrically conductive material to fill said grooves and extend above said grooves, separating said electroformed material from said master mandrel to provide a mandrel substrate of electrically conductive material having a negative pattern of grooves formed therein.

7. The method of claim 5 wherein said step of forming a pattern of grooves comprises etching said mandrel substrate.

8. The method of claim 5 wherein said step of forming a pattern of grooves comprises electron discharge machining said mandrel substrate.

9. The method of claim 5 wherein said mandrel substrate is formed of a stainless steel.

10. The method of claim 5 wherein said mandrel working surface is planar and wherein surfaces of said embedded nonconductive material are mutually coplanar and are coplanar with said mandrel working surface, whereby the surface of said laminate of dielectric material is coplanar with surfaces of said embedded conductors.

11. The method of claim 5 wherein said step of laminating comprises forming a laminate of a dielectric coated with adhesive, applying said laminate to said mandrel with said adhesive in contact with the mandrel and conductors, and causing said adhesive to flow over and around said conductors.

12. The method of claim 5 wherein said step of laminating comprises forming adjacent layers of a polyamide and adhesive, and heating and pressing said layers against said mandrel to cause said adhesive to flow around and over said conductors.

13. The method of claim 5 further including the step of, after said electroforming step, treating the surface of said conductors on said mandrel to promote adhesion thereof to said dielectric.

14. The method of claim 13 wherein said dielectric is a relatively rigid substrate.

15. The method of claim 8 wherein said dielectric comprises resin impregnated fibers.

16. The method of claim 5 including the step of treating said areas of said working surface to promote release of said conductors.

17. Apparatus for manufacture of electrical circuitry by additive deposition upon a reusable mandrel comprising:
a mandrel body having a planar mandrel surface defined by a first pattern of electrically conductive surface areas separated by a second pattern of electrically nonconductive surface areas, one of said patterns being embedded in said mandrel body, said patterns having coplanar surfaces collectively forming said planar mandrel surface, whereby an electrical circuit can be electrodeposited upon said mandrel body over said first pattern.

18. The apparatus of claim 17 wherein said mandrel body is formed of electrically conductive material and has a pattern of grooves formed therein, and an electrically conductive material in said grooves forming said second pattern.

19. The apparatus of claim 17 including a pattern of electrical conductors electrodeposited on said conductive surface areas, whereby a dielectric substrate may be placed over said electrical conductors and said mandrel to adhere to said conductors and the substrate together with the conductors attached thereto may be separated from the mandrel.

20. The apparatus of claim 19 wherein said electrical conductors have exposed surfaces treated to promote adhesion to said dielectric substrate.

21. The apparatus of claim 17 including a pattern of electrical circuitry electrodeposited on said electrically conductive surface areas, a coating of dielectric material on said mandrel, covering surfaces of said second pattern and said electrical circuitry, whereby said dielectric material and said electrodeposited circuitry can be removed as a unit from said mandrel, and whereby said mandrel can be reused for electrodeposition of further patterns of circuitry.

* * * * *